(12) United States Patent
Asada et al.

(10) Patent No.: US 7,505,240 B2
(45) Date of Patent: Mar. 17, 2009

(54) OVERCURRENT PROTECTION DEVICE FOR SEMICONDUCTOR ELEMENT

(75) Inventors: Tadatoshi Asada, Anjo (JP); Hideto Okahara, Kariya (JP); Susumu Ueda, Okazaki (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 11/602,259

(22) Filed: Nov. 21, 2006

(65) Prior Publication Data

US 2007/0146952 A1 Jun. 28, 2007

(30) Foreign Application Priority Data

Dec. 28, 2005 (JP) ............................. 2005-378733

(51) Int. Cl.
*H02H 3/08* (2006.01)
*H02H 9/02* (2006.01)
*G05F 3/02* (2006.01)

(52) U.S. Cl. .................. 361/93.1; 327/539; 327/541; 438/238

(58) Field of Classification Search ............... 361/93.1; 327/539, 541; 438/238
See application file for complete search history.

(56) References Cited

U.S. PATENT DOCUMENTS

| 3,974,438 | A | * | 8/1976 | Alves, III | 330/2 |
| 4,553,084 | A | | 11/1985 | Wrathall | |
| 5,439,841 | A | * | 8/1995 | Alter | 438/238 |
| 5,635,823 | A | * | 6/1997 | Murakami et al. | 323/277 |
| 5,825,234 | A | | 10/1998 | Sung et al. | |
| 6,111,494 | A | * | 8/2000 | Fischer et al. | 338/320 |
| 6,246,734 | B1 | * | 6/2001 | Ohuchi et al. | 375/357 |
| 6,262,400 | B1 | * | 7/2001 | Urbank et al. | 219/497 |
| 6,504,315 | B2 | * | 1/2003 | Kim | 315/224 |
| 6,633,473 | B1 | * | 10/2003 | Tomomatsu | 361/93.7 |
| 6,864,741 | B2 | * | 3/2005 | Marsh et al. | 327/539 |
| 2003/0169072 | A1 | | 9/2003 | Kinugawa et al. | |
| 2004/0097031 | A1 | * | 5/2004 | Lee et al. | 438/238 |

FOREIGN PATENT DOCUMENTS

| DE | 42 23 338 | 1/1994 |
| DE | 100 35 388 | 2/2002 |
| JP | A-2003-218673 | 7/2003 |

OTHER PUBLICATIONS

Office Action dated Apr. 29, 2008 and Partial European Search Report dated Apr. 28, 2008 in corresponding European Patent Application No. 06025052.9-1233.
Extended European Search Report dated Jul. 28, 2008 in corresponding European patent application No. 06025052.9.

* cited by examiner

*Primary Examiner*—Michael J Sherry
*Assistant Examiner*—Zeev Kitov
(74) *Attorney, Agent, or Firm*—Posz Law Group, PLC

(57) ABSTRACT

An overcurrent protecting device for protecting a semiconductor element from an overcurrent includes: the semiconductor element; a shunt resistor for detecting the overcurrent when the electric current in the semiconductor element exceeds a threshold value; a reference resistor for setting the threshold value; a constant electric current circuit for supplying a constant electric current to the reference resistor; and a comparator for comparing a terminal voltage of the shunt resistor and a terminal voltage of the reference resistor. The shunt resistor is made of a same kind of resistor as the reference resistor.

11 Claims, 6 Drawing Sheets

OVERCURRENT PROTECTION DEVICE FOR SEMICONDUCTOR ELEMENT

CROSS REFERENCE TO RELATED APPLICATION

This application is based on Japanese Patent Application No. 2005-378733 filed on Dec. 28, 2005, the disclosure of which is incorporated herein by reference.

FIELD OF THE INVENTION

The present invention relates to an overcurrent protection device for protecting a semiconductor element from an overcurrent.

BACKGROUND OF THE INVENTION

In general, the electronic device, etc. mounted to the vehicle are operated under an environment tending to be extremely changed in temperature. Therefore, it becomes an important subject that the electronic device, etc. are stably operated by excluding an influence of temperature in accordance with a function of the electronic device. When protection against an overcurrent is performed with respect to the semiconductor element for a driver for outputting a communication signal with respect to the electronic device to the communication line, it is also desirable to stably perform this protecting operation without being influenced by temperature.

For example, Japanese Patent Application Publication No. 2003-218673 discloses a construction for detecting a consumed electric current of a sensor by using a shunt resistor in a circuit to perform overload and short circuit detection with respect to a slave for an actuator sensor interface circuit.

Further, U.S. Pat. No. 4,553,084 discloses a construction in which a transistor for mainly flowing a load electric current and a transistor for detecting the electric current by the shunt resistor are connected in parallel and are constructed on one chip, and a cell ratio of the transistors is set to a suitable ratio so that the detection is performed by flowing a microscopic electric current onto the shunt resistor side.

However, no temperature characteristics provided in the shunt resistor are considered in a technique disclosed in Japanese Patent Application Publication No. 2003-218673. In addition, this technique is set to a construction for judging a voltage drop caused in this shunt resistor by utilizing the voltage between a base and an emitter of the transistor. Therefore, it is easily influenced by temperature. As its result, a problem exists in that a protecting electric current value greatly depends on operation temperature.

A technique disclosed in U.S. Pat. No. 4,553,084 is suitable for a case for using a power transistor as in the treatment of a large electric current. However, more transistors are required. When it is supposed that this technique is applied to the protection of the semiconductor element for a driver for outputting the communication signal to the electronic device mounted to the vehicle, a transistor for adjusting the electric current is excessively added so that the construction becomes complicated. Further, since the shunt resistor is used in the electric current detection, there is a problem similar to that of Japanese Patent Application Publication No. 2003-218673.

SUMMARY OF THE INVENTION

In view of the above-described problem, it is an object of the present disclosure to provide an overcurrent protection device for protecting a semiconductor element from an overcurrent.

An overcurrent protecting device for protecting a semiconductor element from an overcurrent includes: the semiconductor element for outputting a signal to a communication line in order to communicate with an electronic device mounted on an automotive vehicle; a shunt resistor for detecting an electric current flowing through the semiconductor element, wherein the shunt resistor detects the overcurrent when the electric current in the semiconductor element exceeds a threshold value; a reference resistor for setting the threshold value for starting a protecting operation with respect to the overcurrent; a constant electric current circuit for supplying a constant electric current to the reference resistor; and a comparator for comparing a terminal voltage of the shunt resistor and a terminal voltage of the reference resistor. The shunt resistor is made of a same kind of resistor as the reference resistor.

In the above device, the shunt resistor and the reference resistor have the same temperature characteristics so that changes of the terminal voltages due to a temperature change are canceled. Accordingly, a stable overcurrent protecting operation can be realized by a simple construction without being influenced by temperature.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

Figure 1:
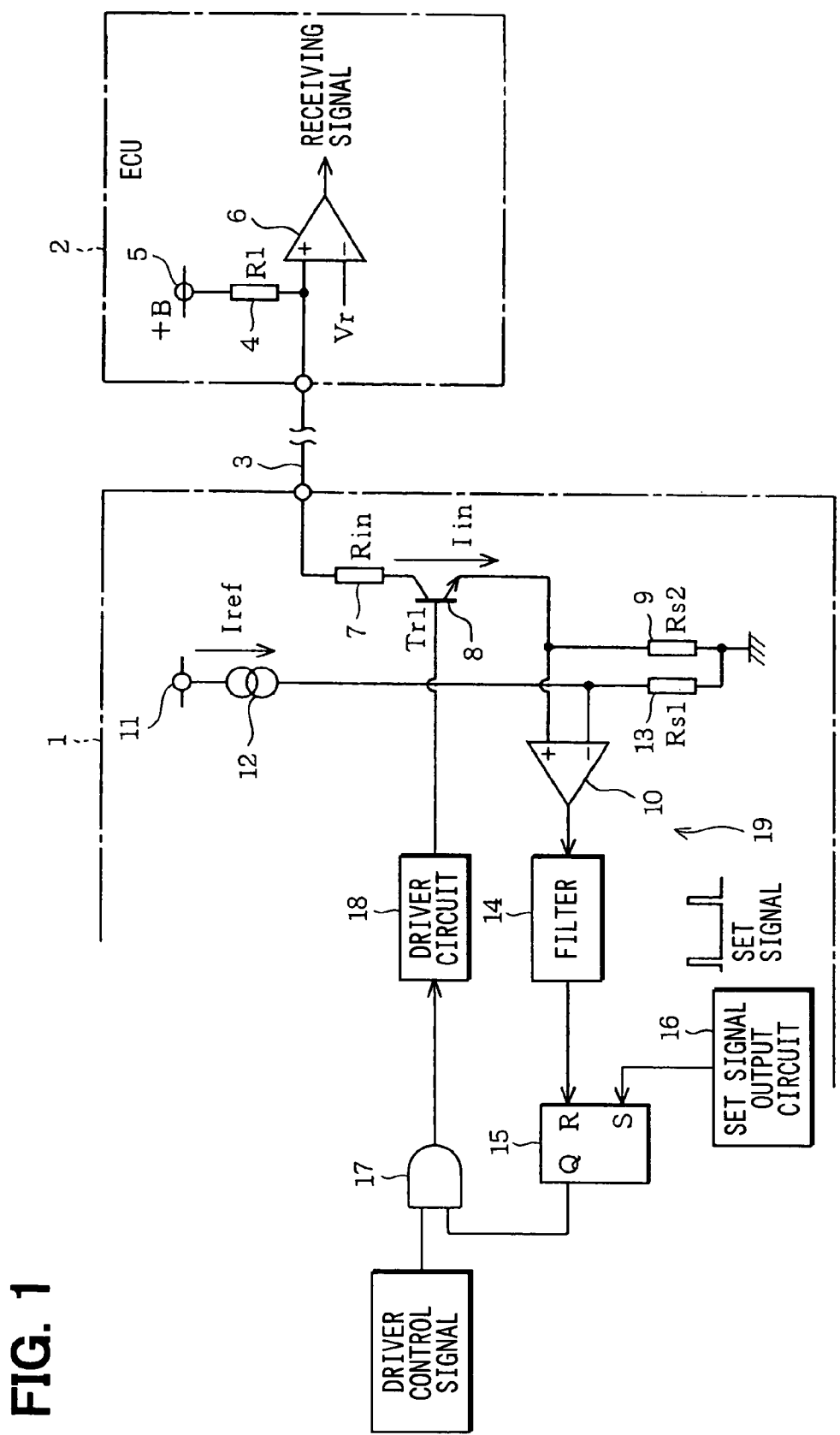
FIG. 1 is a view schematically showing a system construction when communication is performed between ECUs for vehicle mounting.

FIG. 1 schematically shows a system construction when communication is performed between ECUs (Electronic Control Units) as electronic devices for vehicle mounting. In this example, ECU 1 is arranged on a signal transmitting side, and ECU 2 is arranged on a signal receiving side, and both ECUs 1 and 2 are connected through a communication line 3. Here, when a relationship of Rs2×Iin>Rs1×Iref is satisfied, a protection operation is executed. At a normal time, a relationship of VB/(R1+Rin+Rs2) is satisfied, and at a power source short-circuit time, a relationship of VB/(Rin+Rs2) is satisfied.

In ECU 2 of the signal receiving side, the communication line 3 is connected to a vehicle mounting battery 5 (+B) through a load resistor 4 (R1), and is also connected to a non-inversion input terminal of a comparator 6 for signal reception. A reference voltage Vr for comparing a receiving signal level is given to an inversion input terminal of the comparator 6.

On the other hand, in ECU 1 of the signal transmitting side, the communication line 3 is connected to the ground through an input resistor 7 (Rin), an NPN transistor (a semiconductor element for a driver) 8 as a driver for communication, and a shunt resistor 9 (Rs2) for electric current detection, and is also connected to a non-inversion input terminal of a comparator 10. A series circuit of a constant electric current circuit 12 and a reference resistor 13 is connected between an electric power source 11 and the ground. A common connection point of both the constant electric current circuit 12 and the reference resistor 13 is connected to an inversion input terminal of the comparator 10. The constant electric current circuit 12 supplies a constant electric current Iref to the reference resistor 13 so that a threshold value voltage for detecting an overcurrent is given to the comparator 10 by a terminal voltage of the reference resistor 13.

An output terminal of the comparator 10 is connected to a reset terminal of a flip flop (holding circuit) 15 through a low-pass filter (delay circuit) 14 for removing noises. A set signal is periodically given to a set terminal of the flip flop 15 by a set signal output circuit (reset circuit) 16. A driver control signal is transmitted to the base of a transistor 8 (Tr1) through an AND gate 17 and a driving circuit 18. A Q-output terminal of the flip flop 15 is connected to the other input terminal of the AND gate 17. In the construction of ECU 1, elements removing the resistor 7, the transistor 8 and the driving circuit 18 therefrom constitute an overcurrent protecting device 19.

Figure 3A:
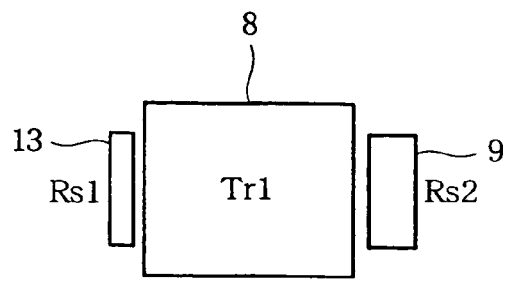
FIGS. 3A and 3B are views conceptually showing an element arrangement example when a transistor for a driver, a shunt resistor and a reference resistor are formed on a semiconductor substrate.
Figure 3B:
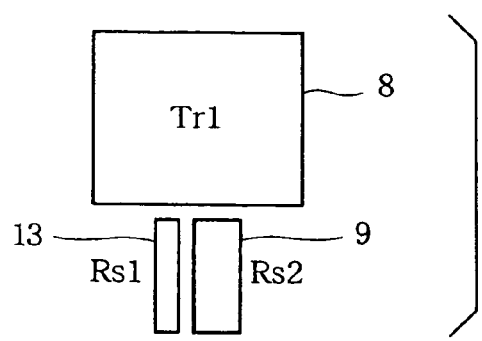

FIGS. 3A and 3B conceptually show element arrangement examples when the transistor 8, the shunt resistor 9 and the reference resistor 13 are formed on a semiconductor substrate. FIGS. 3A and 3B respectively show different arrangements. However, in each of these cases, thermal coupling degrees of each of the resistors 9, 13 with respect to the transistor 9 are respectively set to be equal by arranging the resistors 9 and 13 in proximity to the transistor 8 generating heat at an operating time. FIG. 3A shows a case in which the resistors 9 and 13 are symmetrically arranged on both the left and right sides of a forming area of the transistor 8. FIG. 3B shows a case in which the resistors 9 and 13 are arranged at an equal distance on one side of the above area. The resistors 9 and 13 equally receive an influence of the heat generated by the transistor 8 by setting the arrangements in this way.

Figure 4:
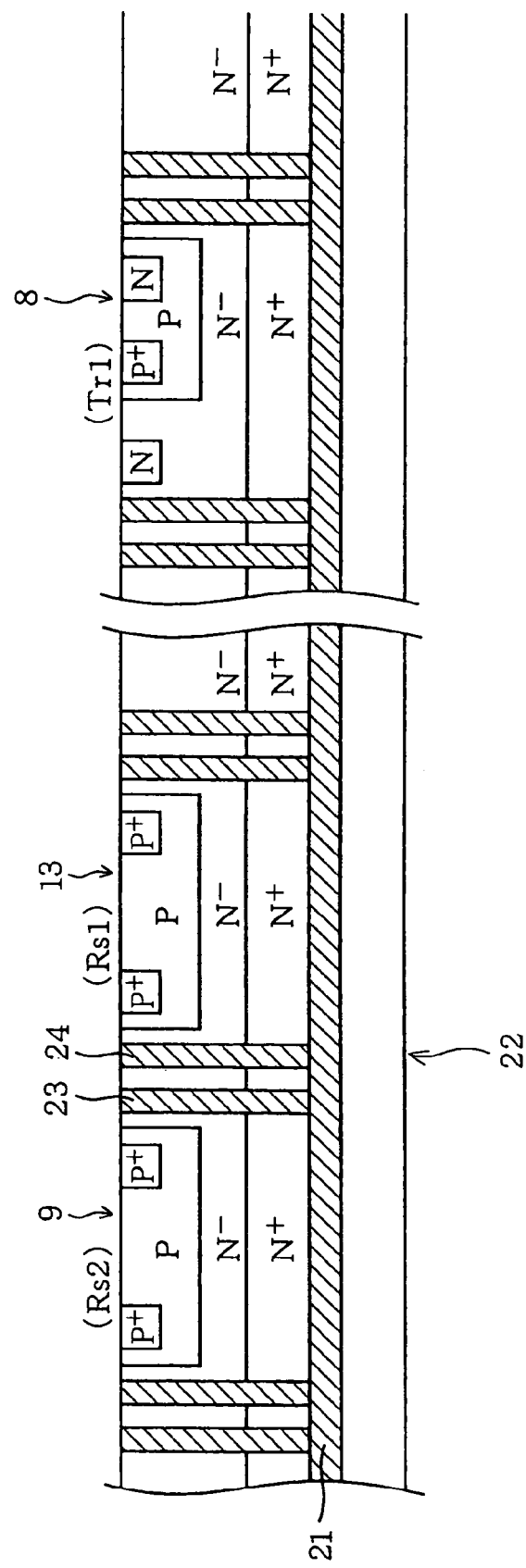
FIG. 4 is a cross-sectional view typically showing a forming state of the semiconductor substrate of each element mentioned above.

FIG. 4 is a typical sectional view showing element forming states of the transistor 8, the shunt resistor 9 and the reference resistor 13. Each circuit element constituting ECU 1 is formed on a SOI (Silicon On Insulator) substrate 22 having a burying oxide film ($SiO_2$) 21. Each of the transistor 8, the shunt resistor 9 and the reference resistor 13 is formed in an area trench-separated by burying an oxide film material (insulating film material) 24 within a trench 23 reaching the burying oxide film 21. The resistors 9 and 13 are formed as P-type diffusion resistors of the same kind. FIG. 4 does not show that the transistor 8 is formed in the rightward direction of the resistors 9 and 13 in this figure, but shows that, e.g., a forming state as shown in FIG. 3B is arranged by intermediately breaking this forming state.

Electric insulation between the respective elements is preferably secured by performing the formation in this way. Further, the coefficient of thermal conductivity of $SiO_2$ as the oxide film material 24 is about 1/10 of the coefficient of thermal conductivity of Si as a main material of the substrate 22 when this coefficient of thermal conductivity of Si is set to "1". Hence, the coefficient of thermal conductivity of $SiO_2$ is extremely low. Accordingly, after the resistors 9 and 13 are basically set to a state difficult to have a circumferential thermal influence, only a thermal influence of the transistor 8 relatively close to the resistors 9 and 13 is set to be easily exerted.

Figure 5:
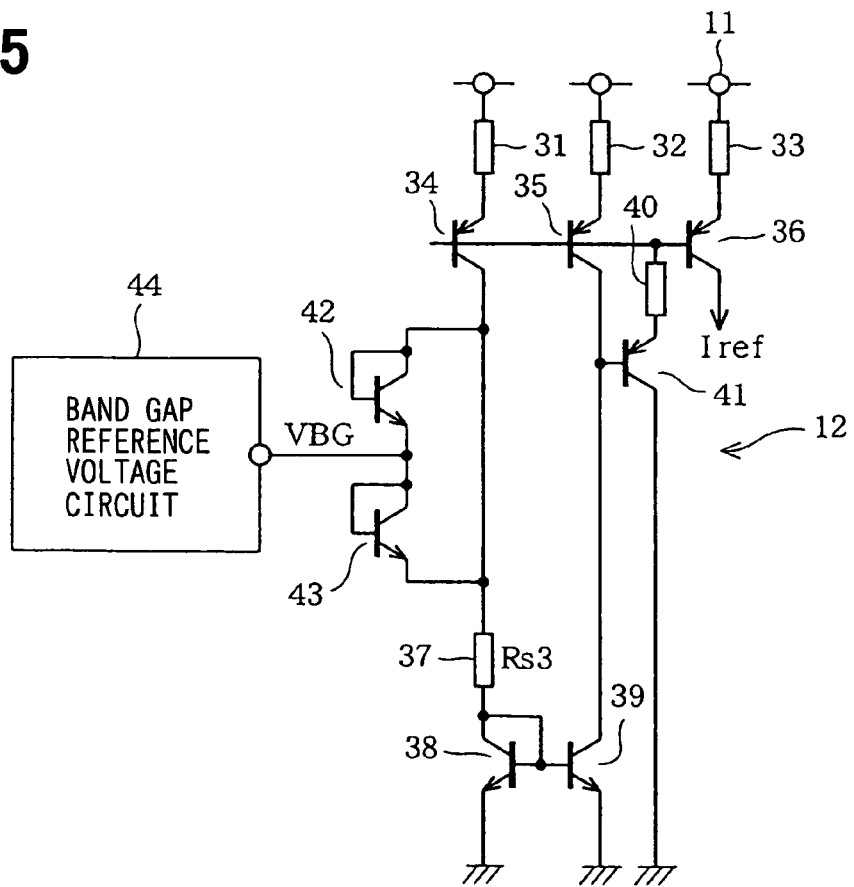
FIG. 5 is a view showing the detailed construction of a constant electric current circuit.

FIG. 5 is a view showing the detailed construction of the constant electric current circuit 12. Emitters of PNP transistors 34 to 36 forming one portion of a mirror circuit by commonly connecting bases are respectively connected through resistors 31 to 33 in the electric power source 11. A collector of the transistor 34 is connected to the ground through a resistor 37 and the collector-emitter of an NPN transistor 38. A collector of the transistor 35 is connected to the ground through the collector-emitter of an NPN transistor 39 forming a mirror pair together with the transistor 38. Namely, the bases of the transistors 38, 39 are commonly connected to the collector of the transistor 38. Further, the resistor 37 is arranged to start the constant electric current circuit 12, and is constructed by a metallic thin film resistance element such as CrSi, etc. Here, an upper end voltage of the resistor 37 is VBG+VBE (42), and a lower end voltage of the resistor 37 is VBE (38).

The base of the transistor 36 is connected to the ground through a resistor 40 and the emitter-collector of a PNP transistor 41. The base of the transistor 41 is connected to the collector of the transistor 35. Further, a series circuit of NPN transistors 42 and 43 diode-connected is connected to the collector of the transistor 34 in parallel. An output terminal of a band gap reference voltage circuit 44 is connected to a common connection point of this series circuit.

The band gap reference voltage circuit 44 outputs a band gap reference voltage VBG. In this case, an upper end voltage of the resistor 37 is (VBG+VBE (transistor 42)), and a lower end voltage of the resistor 37 is VBE (transistor 38). Accordingly, a constant electric current Iref supplied by the collector of the transistor 36 becomes as follows.

$$Iref=(VBG+VBE(42)-VBE(38))/Rs3(37)$$

$$=VBG/Rs3$$

Accordingly, the constant electric current Iref is determined by the band gap reference voltage VBG and the resistance value Rs3 of the resistor 37.

Figure 6:
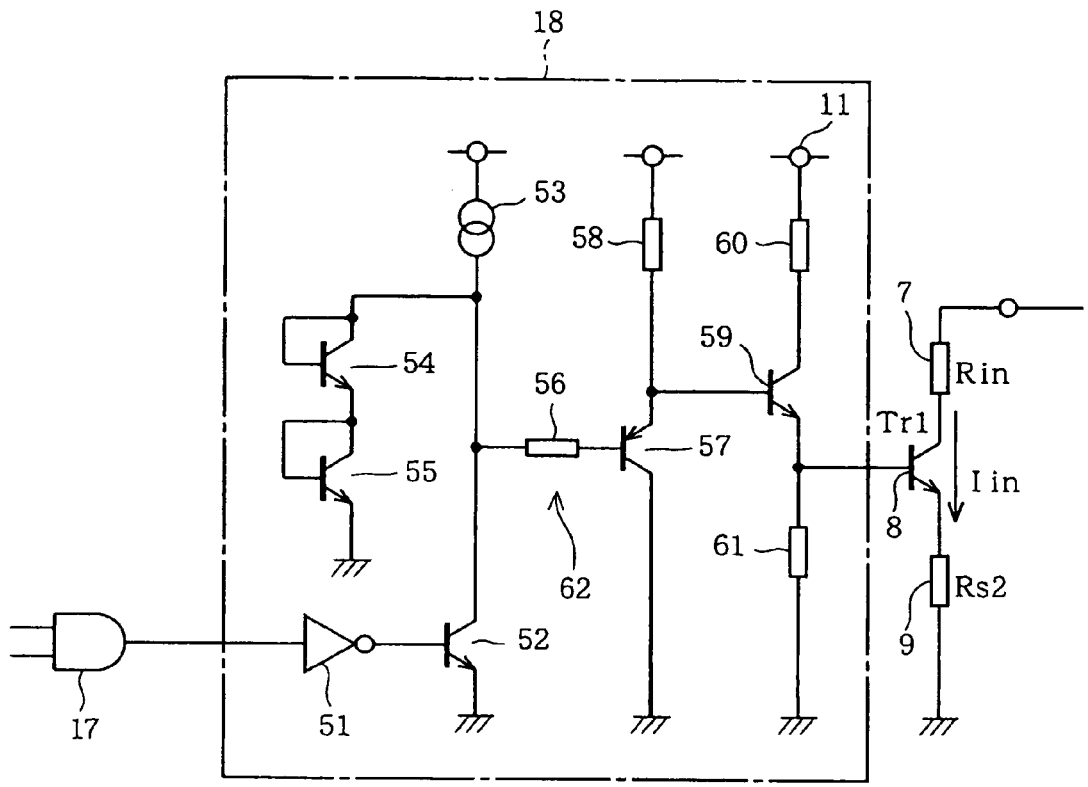
FIG. 6 is a view showing the detailed construction of a driving circuit.

FIG. 6 shows the detailed construction of the driving circuit 18. An output terminal of the AND gate 17 is connected to the base of an NPN transistor 52 through an inverter gate 51. An emitter of the transistor 52 is connected to the ground, and a collector of the transistor 52 is connected to the electric power source 11 through a constant electric current circuit 53, and is also connected to the ground through a series circuit of NPN transistors 54 and 55 diode-connected. Further, the collector of the transistor 52 is connected to the base of a PNP transistor 57 through a resistor 56. A collector of the transistor 57 is connected to the ground and an emitter of the transistor 57 is connected to the electric power source 11 through a resistor 58.

The collector of an NPN transistor 59 of an output stage is connected to the electric power source 11 through a resistor 60, and an emitter of the transistor 59 is connected to the ground through a resistor 61. A base of the transistor 59 is connected to the emitter of the transistor 57. The emitter of the transistor 59 is connected to the base of the transistor 8.

In the driving circuit 18, a condition for turning-on the transistor 59 of the output stage and operating the transistor 8 for a driver is provided as follows. Numbers within parentheses show reference numerals of transistors. When the transistor 8 is turned on, a flowed electric current is set to Iin. In this case, the following relation is formed.

$$VBE(55)+VBE(54)+VBE(57)>VBE(59)+VBE(8)+Rs2\cdot Iin$$

If each VBE is equal, the following relation is formed.

$$VBE(57)>Rs2\times Iin$$

Namely, it is constructed such that an amplifying stage number of signals in the driving circuit 18 and the transistor 8 is two stages including the transistor 8 and adding the transistor 59 of an output stage of the driving circuit 18, but a number provided by adding the voltage VBE between the base and the emitter on the left-hand side becomes "3" greater by one stage than this stage number. In the driving circuit 18, transistors 52, 54, 55, 57 and constant electric current circuit 53 and resistor 56 constitute a limiter circuit 62.

Figure 7:
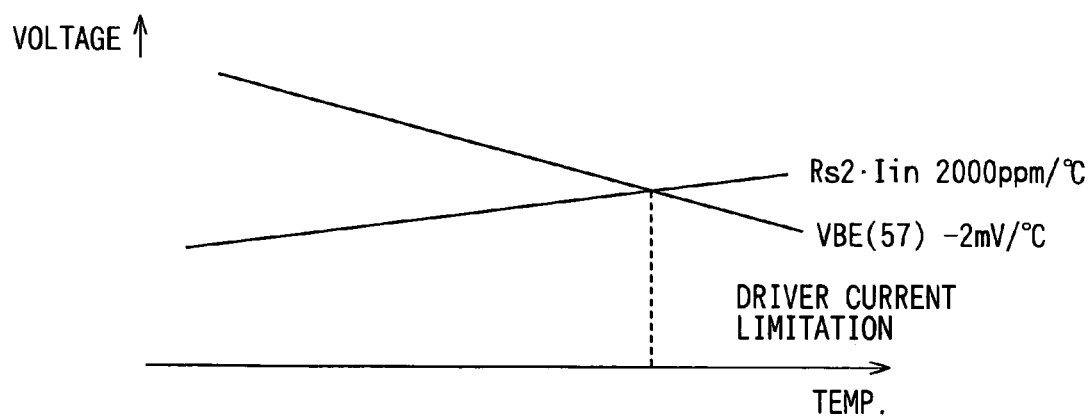
FIG. 7 is a view showing temperature characteristics of voltage VBE between a base and an emitter of a transistor, and a terminal voltage (Rs2×Iin) of the shunt resistor.

FIG. 7 shows temperature characteristics of the voltage VBE (57) between the base and the emitter of the transistor 57, and a terminal voltage (Rs2×Iin) of the shunt resistor 9. The terminal voltage (Rs2×Iin) has positive temperature characteristics 2000 ppm/° C. In contrast to this, the voltage VBE (57) between the base and the emitter has negative temperature characteristics −2 mV/° C. Accordingly, if the transistor 57 and the shunt resistor 9 are used in an area higher in temperature than a crossing point of both the temperature characteristics, the electric current Iin flowed to the transistor 8 can be limited by VBE (57).

Figure 2:
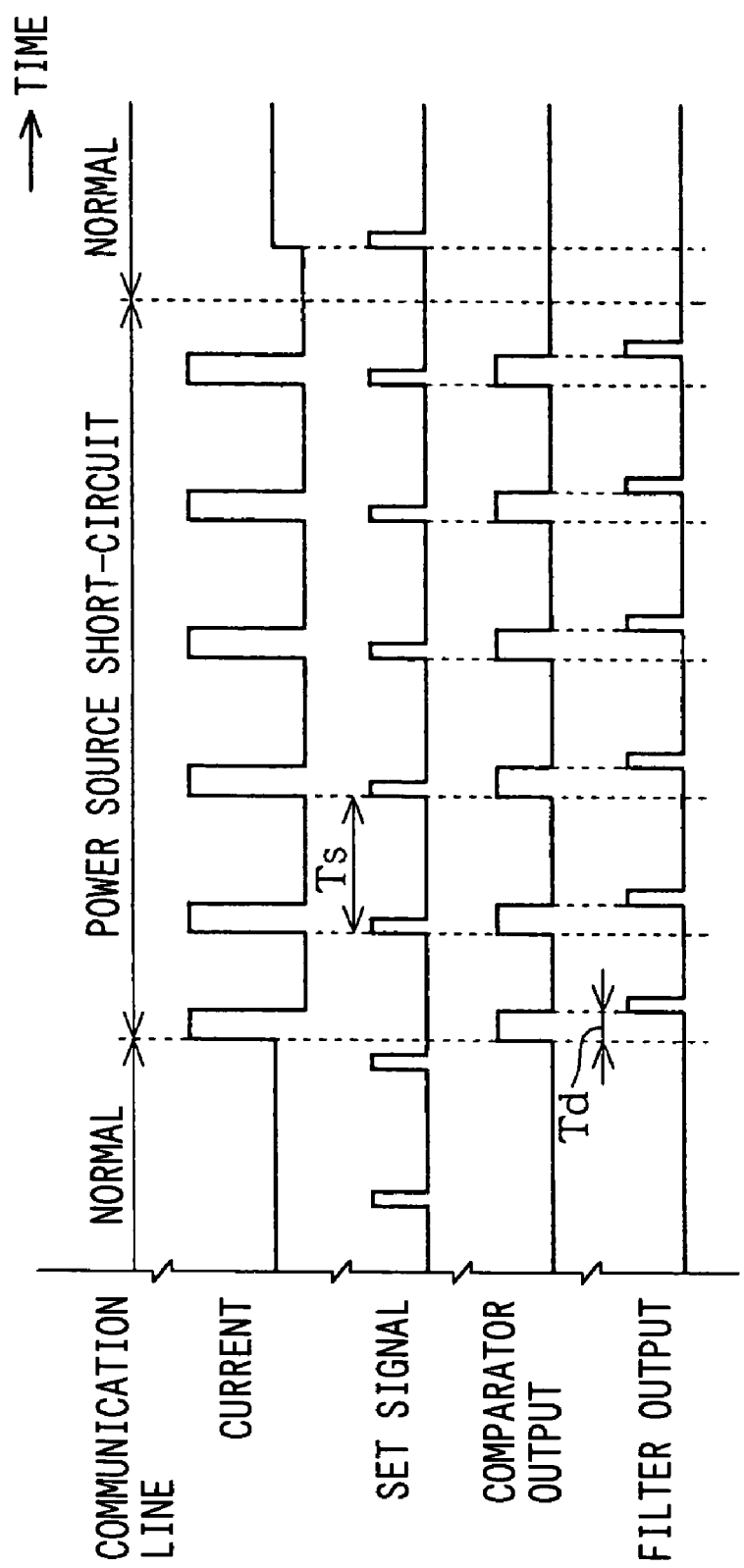
FIG. 2 is a timing chart showing a signal waveform of each portion involved by the operation of an overcurrent protecting device.

Next, the operation of this embodiment will be explained by also referring to FIG. 2. FIG. 2 is a timing chart showing a signal waveform of each portion involved by the operation of the overcurrent protecting device 19. The overcurrent protecting device 19 detects an overcurrent flowed to the communication line 3 when the communication line 3 attains a state short-circuited to the vehicle mounting battery 5. The overcurrent protecting device 19 is then operated so as to stop the output of a driver control signal. Namely, if the electric current flowed to the communication line 3 lies within a normal range when the transistor 8 is turned on, a set signal is periodically given to the flip flop 15 by the set signal output circuit 16 (see FIG. 2(c)). Therefore, the output level of a Q-terminal attains a high level, and the driver control signal is outputted to the driving circuit 18 through the AND gate 17.

When the above short circuit state is then generated, the electric current flowed to the communication line 3 is increased and the terminal voltage of the shunt resistor 9 is raised. When this terminal voltage exceeds the terminal voltage of the reference resistor 13 (Rs2×Iin>Rs1×Iref), the output level of the comparator 10 is changed from a low level to a high level, and the flip flop 15 is reset. Accordingly, the output of the driver control signal is prevented by the AND gate 17. At this time, with respect to the output change of the comparator 10, an output signal of a filter 14 is delayed by delay time Td based on a filter time constant and is outputted (see FIGS. 2(d) and 2(e)). As its result, the overcurrent is flowed through the transistor 8 only during delay time Td (see FIG. 2(b)).

Further, the flip flop 15 is periodically (Ts) set by the set signal output circuit 16. Therefore, while a power source short circuit is generated, the flip flop 15 is repeatedly set and reset. Accordingly, the overcurrent repeats a state flowed only during the delay time Td. The flip flop 15 is periodically set in this way because it is expected to dissolve the short circuit state during the continuation of the periodic setting since a case for accidentally generating the power source short circuit of the communication line 3 by a vibration applied to a vehicle is also supposed.

In the above "set", the flip flop 15 holds an output state change of the comparator 10 by "resetting" the flip flop 15 by this output state change when the overcurrent is detected. Accordingly, the above "set" corresponds to "reset" described in claim 6 in the meaning that this holding state is cleared.

Here, a condition in which an average of heat quantity for time TS generated when a state for flowing the overcurrent only during delay time Td is repeated in period Ts is smaller than that in a case for flowing a normal electric current during set period Ts is supposed at the power source short circuit time. When a saturation voltage between the collector and the emitter is neglected, the electric current flowed through the transistor 8 in a normal state is provided as follows.

$$VB/(R1+Rin+Rs2)$$

Since the load resistor 4 is short-circuited, the electric current flowed at the power source short circuit time is provided as follows.

$$VB/(Rin+Rs2)$$

Accordingly, electric power generated in a conducting period of each electric current is provided as follows.

$$(VB^2/(R1+Rin+Rs2))\times Ts > (VB^2/(Rin+Rs2))\times Td$$

Since (Rin+Rs2)/(R1+Rin+Rs2)>Td/Ts is formed, (Rin+Rs2)/R1>Td/Tr is obtained if condition (R1>>(Rin+Rs2)) is satisfied. Accordingly, if the ratio of each resistance value is set as mentioned above, the time average of heat quantity generated by flowing the overcurrent for only time Td at the overcurrent detecting time becomes smaller than that of heat quantity generated when the normal electric current is flowed during set period Ts.

As mentioned above, in accordance with this embodiment, the overcurrent protecting device 19 for protecting the transistor 8 for outputting a communication signal to the communication line 3 is constructed such that the shunt resistor 9 for detecting the electric current flowed through the transistor 8, and the reference resistor 13 for setting a threshold value for starting a protecting operation with respect to the overcurrent are formed by P-type diffusion resistors of the same kind. Further, the overcurrent protecting device 19 is constructed such that the terminal voltage of the shunt resistor 9 and the terminal voltage generated by supplying a constant electric current to the reference resistor 13 are compared by the comparator 10, and the overcurrent is detected. Accordingly, the shunt resistor 9 and the reference resistor 13 have the same temperature characteristics. Therefore, changes of both the terminal voltages due to a temperature change are canceled. Accordingly, a stable overcurrent protecting operation can be realized by a simple construction without being influenced by temperature.

Further, the shunt resistor 9 and the reference resistor 13 are arranged such that a conducting state of heat generated by the transistor 8 becomes equal with respect to the transistor 8. Concretely, the shunt resistor 9 and the reference resistor 13 are spaced and arranged at an equal interval with respect to an arranging area of the transistor 8 so as to be adjacent to the arranging area of the transistor 8. Accordingly, the resistors 9 and 13 equally have the influence of heat generated by operating the transistor 8 so that the protecting operation can be more stabilized.

Further, the transistor 8, the shunt resistor 9 and the reference resistor 13 are formed on the SOI substrate 22, and mutual element forming areas are separated by the oxide film material 24. Accordingly, it is set to be more difficult to mutually have thermal influences due to other factors, and the resistors 9 and 13 are then set to easily have only an influence of the transistor 8 so that detection accuracy can be improved.

Further, the overcurrent protecting device 19 holds the output state change of the comparator 10 by the flip flop 15, and its holding state is periodically reset ("set" in FIG. 1) by the set signal output circuit 16. Accordingly, when the power source short circuit is temporarily generated, it is possible to expect that it is returned to the normal state and communication is restarted while the flip flop 15 is continuously periodically reset.

Further, a time ratio of signal delay time Td of the filter 14 inserted between the comparator 10 and the flip flop 15 and set period Ts in the set signal output circuit 16 is set so as to become a ratio or less of a resistance value provided by adding the resistance value of the shunt resistor 9 to the resistance value of the input resistor 7 of the transistor 8 and the resistance value of the load resistor 4 on the ECU 2 side as a communication destination. Accordingly, the time average of heat quantity generated by flowing the overcurrent only during set period Ts can be set to be smaller than that provided in a case in which the normal electric current is flowed during set period Ts. Accordingly, a temperature rise can be restrained even when the detecting result holding state of the flip flop 15 is periodically reset.

Further, the limiter circuit 62 clamps a base electric potential outputted to the transistor 8 for a driver by the driving circuit 18 at a voltage high by one amount of the voltage VBE between the base and the emitter with respect to an amplifying stage number provided by combining the transistor 8 and the transistor 59 constituting the driving circuit 18. Namely, a voltage drop in the shunt resistor 9 is prescribed by the operation of the limiter circuit 62. As a result, when operation environment temperature is high, the conducting electric current Iin is limited by the voltage VBE between the base and the emitter. Accordingly, for example, it is possible to restrain a rush electric current value flowed in checking whether a power source short circuit state is generated or not.

In addition, the constant electric current circuit 12 is constructed by using the band gap reference voltage circuit 44 and the metallic thin film resistor 37. Namely, the band gap reference voltage has a small temperature coefficient, and the metallic thin film resistor 37 also has a small temperature coefficient. Accordingly, constant electric current Iref for giving a reference electric potential for comparison by the reference resistor 13 can be stably outputted without being influenced by temperature.

The present invention is not limited to only the embodiments mentioned above or described in the drawings, but can be modified as follows.

The shunt resistor 9 and the reference resistor 13 are not limited to the construction as the P-type diffusion resistors, but no kind of resistor is limited if both the shunt resistor 9 and the reference resistor 13 are the same.

Figure 8:
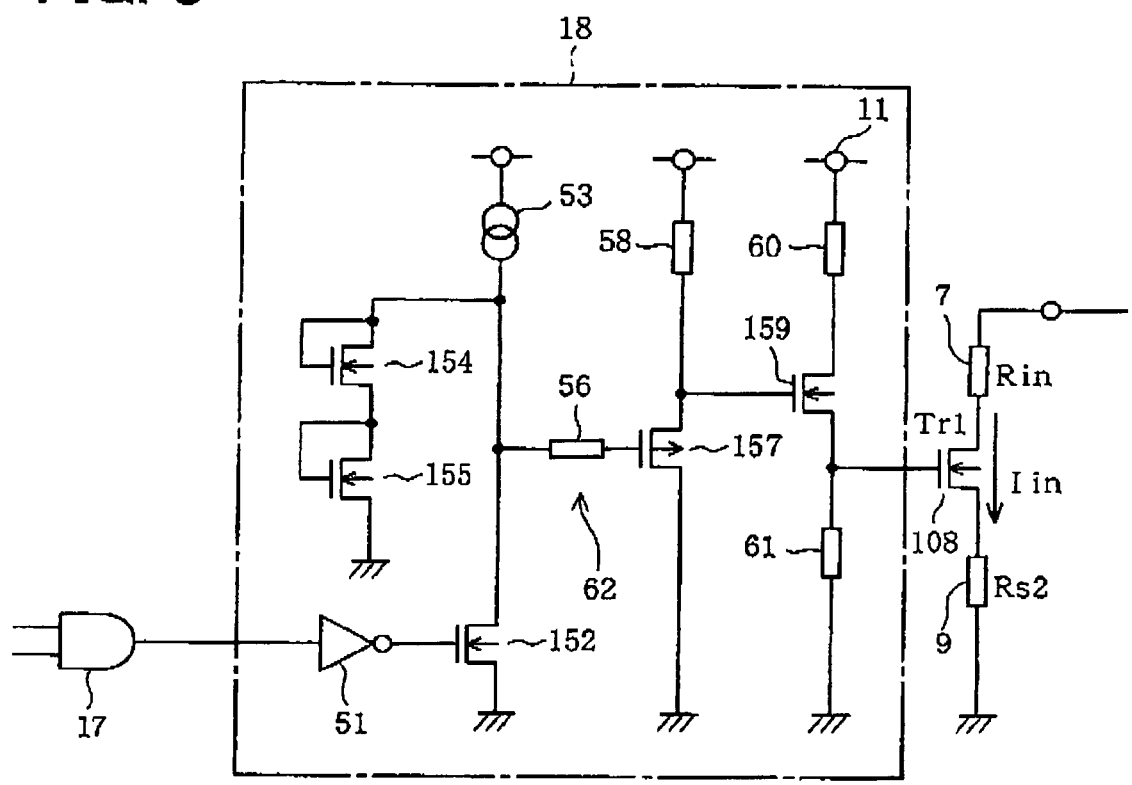
FIG. 8 is a view showing the detailed construction of another driving circuit.

The semiconductor element 1 for a driver may be also constructed by MOSFETs 108, 152, 154, 155, 157, 159, as shown in FIG. 8. In this case, the limiter circuit 62 is constructed so as to clamp a gate electric potential outputted to the MOSFET 108 by a driving circuit 18 at a voltage high by one voltage amount VGS between the gate and the source with respect to an amplifying stage number provided by combining MOSFETs 152, 154, 155, 157 constituting the driving circuit 18 and the semiconductor element 1 for a driver.

The transistor 8 and the resistors 9 and 13 may be constructed so as to be formed in the SOI substrate 22 by trench separation in accordance with necessity.

The arranging mode of the transistor 8 and the resistors 9 and 13 is not limited to that shown in FIGS. 3A and 3B, but may be also set to an arranging state in which the influence of heat generated by the transistor 8 is equally exerted with respect to the resistors 9 and 13.

The relation of signal delay time Td of the filter 14 and set period Ts of the set signal output circuit 16 is also not limited to the relation presented in the above embodiment, but may be also suitably set.

Further, when no filtering function using the filter is required, a delay circuit may be also arranged instead of the filter 14.

It is not necessary to periodically set the flip flop 15. For example, when an unillustrated CPU of ECU 1 judges that the flip flop 15 is required, the flip flop 15 may be also set.

The constant electric current circuit 12 is not necessarily limited so as to be constructed by the metallic thin film resistor 37 and the band gap reference voltage circuit 44.

The limiter circuit 62 may be also arranged in accordance with necessity.

Communication is not limited to communication performed between ECUs 1 and 2, but can be widely applied if a communication object is an electronic device for vehicle mounting.

The above disclosure has the following aspects.

An overcurrent protecting device for protecting a semiconductor element from an overcurrent includes: the semiconductor element for outputting a signal to a communication line in order to communicate with an electronic device mounted on an automotive vehicle; a shunt resistor for detecting an electric current flowing through the semiconductor element, wherein the shunt resistor detects the overcurrent when the electric current in the semiconductor element exceeds a threshold value; a reference resistor for setting the threshold value for starting a protecting operation with respect to the overcurrent; a constant electric current circuit for supplying a constant electric current to the reference resistor; and a comparator for comparing a terminal voltage of the shunt resistor and a terminal voltage of the reference resistor. The shunt resistor is made of a same kind of resistor as the reference resistor.

In the above device, the shunt resistor and the reference resistor have the same temperature characteristics so that changes of the terminal voltages due to a temperature change are canceled. Accordingly, a stable overcurrent protecting operation can be realized by a simple construction without being influenced by temperature.

Alternatively, the shunt resistor and the reference resistor may be arranged in such a manner that heat conduction in the shunt resistor is substantially equal to heat conduction in the reference resistor, and heat is generated by the semiconductor element. In this case, the semiconductor element generates heat due to electric conduction as the semiconductor element is operated. Therefore, in accordance with the above construction, both the resistors equally have a thermal influence of the semiconductor element so that the protecting operation can be more stabilized.

Alternatively, the semiconductor element, the shunt resistor and the reference resistor may be disposed on a SOI substrate, and the semiconductor element, the shunt resistor and the reference resistor are separated one another by an insulation film in the SOI substrate. In this case, the coefficient of thermal conductivity of the insulating film material is extremely small in comparison with the coefficient of thermal conductivity of a material constituting a semiconductor substrate. Accordingly, if the overcurrent protecting device is constructed as mentioned above, it becomes more difficult to mutually exert the thermal influences between the respective elements so that the thermal conducting states become equal.

Alternatively, the shunt resistor may be adjacent to the semiconductor element, and the reference resistor may be adjacent to the semiconductor element. In this case, it is possible to set the thermal conducting states between this element and both the resistors to be difficult to have influences due to other factors.

Alternatively, the shunt resistor may be disposed apart from the semiconductor element by a predetermined distance, and the reference resistor may be disposed apart from the semiconductor element by the predetermined distance. In this case, the thermal conducting states between this element and both the resistors can be equally set by equally setting physical distances.

Alternatively, the device may further include: a holding circuit for holding a change of output of the comparator; and a reset circuit for periodically resetting the change of output of the holding circuit. In this case, an electronic device mounted to a vehicle is also always influenced by a vibration caused by running the vehicle. Therefore, even when a state for detecting the overcurrent is generated, it is also sufficiently supposed that this state is accidentally generated. Therefore, it is also considered that the detecting state of the overcurrent is dissolved by again having the influence of the vibration. Accordingly, while the holding of the output state change of the comparator is continuously periodically reset, it is possible to expect that it is returned to a normal state and communication is restarted.

Alternatively, the device may further include a filter disposed between the comparator and the holding circuit. The filter has a signal delay time. The reset circuit has a reset period. A time ratio between the signal delay time of the filter and the reset period of the reset circuit is equal to or smaller than a ratio between an input resistance of the semiconductor element and a load resistance of the electronic device. In this case, for example, a communication system for inserting a load resistor $R1$, a communication line and an input resistor $Rin$ (including the shunt resistor) between a power source $VB$ and the semiconductor element for a driver is supposed. In this case, when the power source attains a state (power source short circuit) for short-circuiting the load resistor $R1$ so that the overcurrent is detected, the output state change of the comparator is transmitted to the holding circuit after signal delay time $Td$ of the filter has passed from a time point of this detection. Accordingly, a state for flowing the overcurrent ($VB/Rin$) through the semiconductor element for a driver and its input resistor $Rin$ is repeated only during delay time $Td$ with respect to a reset period $Tr$. On the other hand, the electric current flowed through the semiconductor element for a driver becomes ($VB/(R1+Rin)$) in the normal state. Here, when the overcurrent is detected, heat quantity generated until the protecting operation of the semiconductor element for a driver is executed in accordance with this detection and the overcurrent is interrupted, is averaged by the reset period $Tr$. When a condition for setting this averaged value to be smaller than that provided when a normal electric current is flowed during the reset period $Tr$ is supposed, this condition is provided as follows.

$$(VB^2/(R1+Rin))\times Tr > (VB^2/Rin)\times Td$$

$$Rin/(R1+Rin) > Td/Tr,$$

Here, a formula $Rin/R1 > Td/Tr$ is obtained if condition ($R1 >> Rin$) is satisfied. Namely, if condition setting is performed as in claim 7, the time average of heat quantity generated by flowing the overcurrent for only time $Td$ becomes smaller than that provided when the normal electric current is flowed during the reset period $Tr$ so that a temperature rise can be restrained.

Alternatively, the device may further include a driving circuit for operating the semiconductor element. The semiconductor element is a bipolar transistor. The driving circuit provides a base potential to the semiconductor element. The driving circuit includes a limiter circuit and an output side bipolar transistor. The limiter circuit includes a plurality of bipolar transistors. The limiter circuit clamps the base potential at a voltage higher by a voltage between a base and an emitter in one of bipolar transistors in the limiter circuit than sum of a voltage between a base and an emitter in the semiconductor element and a voltage between a base and an emitter in the output side bipolar transistor. In this case, a voltage drop in the shunt resistor is prescribed by the operation of the limiter circuit. As a result, when operation environmental temperature is high, the conducting electric current is limited. Accordingly, for example, it is possible to restrain the value of a rush electric current flowed in checking whether a power source short circuit state is generated or not.

Alternatively, the device may further include a driving circuit for operating the semiconductor element. The semiconductor element is a MOSFET. The driving circuit provides a gate potential to the semiconductor element. The driving circuit includes a limiter circuit and an output side MOSFET. The limiter circuit includes a plurality of MOSFETs. The limiter circuit clamps the gate potential at a voltage higher by a voltage between a gate and a source in one of MOSFETs in the limiter circuit than sum of a voltage between a gate and a source in the semiconductor element and a voltage between a gate and a source in the output side MOSFET. In this case, a voltage drop in the shunt resistor is prescribed by the operation of the limiter circuit. As a result, when operation environmental temperature is high, the conducting electric current is limited. Accordingly, for example, it is possible to restrain the value of a rush electric current flowed in checking whether a power source short circuit state is generated or not.

Alternatively, the constant electric current circuit may include a band gap reference voltage circuit and a metallic thin film resistor. In this case, the band gap reference voltage has a small temperature coefficient, and the metallic thin film resistor also has a small temperature coefficient. Accordingly, if the constant electric current circuit is constructed by the band gap reference voltage circuit and the metallic thin film resistor, a constant electric current for giving a reference electric potential for comparison by the reference resistor can be stably outputted without being influenced by temperature.

Alternatively, the shunt resistor may have temperature characteristics substantially equal to temperature characteristics of the reference resistor. Further, the shunt resistor may be made of a P conductive type diffusion resistor, and the reference resistor may be made of the P conductive type diffusion resistor.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. An overcurrent protecting device for protecting a semiconductor element from an overcurrent, comprising:
   the semiconductor element for outputting a signal to a communication line in order to communicate with an electronic device mounted on an automotive vehicle;
   a shunt resistor for directly detecting an electric current flowing through the semiconductor element, wherein the shunt resistor detects the overcurrent when the electric current in the semiconductor element exceeds a threshold value;
   a reference resistor for setting the threshold value for starting a protecting operation with respect to the overcurrent;
   a constant electric current circuit for supplying a constant electric current to the reference resistor;
   a comparator for comparing a terminal voltage of the shunt resistor and a terminal voltage of the reference resistor;
   a holding circuit for holding a change of output of the comparator;
   a reset circuit for periodically resetting the change of output of the holding circuit; and
   a filter disposed between the comparator and the holding circuit, wherein
   the shunt resistor is made of a same kind of material as the reference resistors,
   the filter has a signal delay time,
   the reset circuit has a reset period, and
   a time ratio between the signal delay time of the filter and the reset period of the reset circuit is equal to or smaller than a ratio between an input resistance of the semiconductor element and a load resistance of the electronic device.

2. The device according to claim 1, wherein
   the semiconductor element, the shunt resistor and the reference resistor are disposed on a SOI substrate, and
   the semiconductor element, the shunt resistor and the reference resistor are separated one another by an insulation film in the SOI substrate.

3. The device according to claim 1, wherein
   the shunt resistor is adjacent to the semiconductor element, and
   the reference resistor is adjacent to the semiconductor element.

4. The device according to claim 1, wherein
   the shunt resistor is disposed apart from the semiconductor element by a predetermined distance, and
   the reference resistor is disposed apart from the semiconductor element by the predetermined distance.

5. An overcurrent protecting device for protecting a semiconductor element from an overcurrent, comprising:
   the semiconductor element for outputting a signal to a communication line in order to communicate with an electronic device mounted on an automotive vehicle;
   a shunt resistor for directly detecting an electric current flowing through the semiconductor element, wherein the shunt resistor detects the overcurrent when the electric current in the semiconductor element exceeds a threshold value;
   a reference resistor for setting the threshold value for starting a protecting operation with respect to the overcurrent;
   a constant electric current circuit for supplying a constant electric current to the reference resistor; and
   a comparator for comparing a terminal voltage of the shunt resistor and a terminal voltage of the reference resistor; and
   a driving circuit for operating the semiconductor element, wherein
   the shunt resistor is made of a same kind of material as the reference resistor,
   the semiconductor element is a bipolar transistor,
   the driving circuit provides a base potential to the semiconductor element,
   the driving circuit includes a limiter circuit and an output side bipolar transistor,
   the limiter circuit includes a plurality of bipolar transistors, and
   the limiter circuit clamps the base potential at a voltage higher by a voltage between a base and an emitter in one of bipolar transistors in the limiter circuit than sum of a voltage between a base and an emitter in the semiconductor element and a voltage between a base and an emitter in the output side bipolar transistor.

6. An overcurrent protecting device for protecting a semiconductor element from an overcurrent, comprising:
   the semiconductor element for outputting a signal to a communication line in order to communicate with an electronic device mounted on an automotive vehicle;
   a shunt resistor for directly detecting an electric current flowing through the semiconductor element, wherein the shunt resistor detects the overcurrent when the electric current in the semiconductor element exceeds a threshold value;
   a reference resistor for setting the threshold value for starting a protecting operation with respect to the overcurrent;
   a constant electric current circuit for supplying a constant electric current to the reference resistor; and
   a comparator for comparing a terminal voltage of the shunt resistor and a terminal voltage of the reference resistor; and
   a driving circuit for operating the semiconductor element, wherein
   the shunt resistor is made of a same kind of material as the reference resistor,
   the semiconductor element is a MOSFET,
   the driving circuit provides a gate potential to the semiconductor element,
   the driving circuit includes a limiter circuit and an output side MOSFET,
   the limiter circuit includes a plurality of MOSFETs, and
   the limiter circuit clamps the gate potential at a voltage higher by a voltage between a gate and a source in one of MOSFETs in the limiter circuit than sum of a voltage between a gate and a source in the semiconductor element and a voltage between a gate and a source in the output side MOSFET.

7. The device according to claim 1, wherein
   the constant electric current circuit includes a band gap reference voltage circuit and a metallic thin film resistor.

8. The device according to claim 1, wherein
   the shunt resistor has temperature characteristics substantially equal to temperature characteristics of the reference resistor.

9. The device according claim 8, wherein
the shunt resistor is made of a P conductive type diffusion resistor, and
the reference resistor is made of the P conductive type diffusion resistor.

10. The device according to claim 1, further comprising:
a driving circuit for driving the semiconductor element, wherein
the driving circuit is independent from the constant electric current circuit.

11. The device according to claim 1, wherein the shunt resistor is connected directly to the semiconductor element.

* * * * *